United States Patent [19]
Eltoukhy et al.

[11] Patent Number: 5,163,180
[45] Date of Patent: Nov. 10, 1992

[54] LOW VOLTAGE PROGRAMMING ANTIFUSE AND TRANSISTOR BREAKDOWN METHOD FOR MAKING SAME

[75] Inventors: Abdelshafy A. Eltoukhy, San Jose; Gregory W. Bakker, Sunnyvale; Chenming Hu, Alamo, all of Calif.

[73] Assignee: Actel Corporation, Sunnyvale, Calif.

[21] Appl. No.: 643,384

[22] Filed: Jan. 18, 1991

[51] Int. Cl.$^5$ .............. H01L 29/06; H01L 27/10; H01L 27/02; H01L 23/48
[52] U.S. Cl. .................. 257/530; 257/900; 257/408; 365/96
[58] Field of Search .............. 357/23.9, 52, 45, 51, 357/54, 71; 365/96

[56] References Cited

U.S. PATENT DOCUMENTS

| | | | |
|---|---|---|---|
| 3,423,646 | 1/1969 | Cubert et al. | 357/51 |
| 3,634,929 | 1/1972 | Yoshida et al. | 357/51 |
| 4,322,822 | 3/1982 | McPherson | 357/51 |
| 4,488,262 | 12/1984 | Basire et al. | 357/51 |
| 4,491,857 | 1/1985 | McElroy | 357/51 |
| 4,499,557 | 2/1985 | Holmberg et al. | 357/51 |
| 4,502,208 | 3/1985 | McPherson | 357/51 |
| 4,507,756 | 3/1985 | McElroy | 357/51 |
| 4,507,757 | 3/1985 | McElroy | 357/51 |
| 4,543,594 | 9/1985 | Mohsen et al. | 357/51 |
| 4,562,639 | 1/1986 | McElroy | 357/51 |
| 4,647,340 | 3/1987 | Szluk et al. | 357/51 |
| 4,758,745 | 8/1988 | Elgamal et al. | 357/51 |
| 4,823,181 | 4/1989 | Mohsen et al. | 357/51 |
| 4,939,386 | 7/1990 | Shibata et al. | 357/23.9 |
| 5,006,911 | 4/1991 | Sivan | 357/23.9 |
| 5,019,878 | 5/1991 | Yang et al. | 357/51 |
| 5,068,696 | 11/1991 | Yang et al. | 357/51 |

*Primary Examiner*—J. Carroll
*Attorney, Agent, or Firm*—Kenneth D'Alessandro

[57] ABSTRACT

An antifuse structure according to a first aspect of the present invention is programmed by snap-back breakdown and includes a semiconductor substrate of a first conductivity type, an insulating layer over the surface of the semiconductor substrate, a conductive gate disposed over the insulating layer, spacer elements disposed at the outer edges of the conductive gate, spaced-apart first and second lightly doped regions of a second conductivity type disposed in the semiconductor substrate, the first and second lightly doped regions aligned to the edges of the conductive gate, third and fourth more heavily doped regions of the second conductivity type disposed in the semiconductor substrate, the third and fourth regions contiguous with the first and second regions, respectively, and aligned to the edges of the spacer elements, and a conductive filament in the insulating layer connecting the conductive gate to one of the second and fourth doped regions.

9 Claims, 2 Drawing Sheets

LOW VOLTAGE PROGRAMMING ANTIFUSE AND TRANSISTOR BREAKDOWN METHOD FOR MAKING SAME

BACKGROUND OF THE INVENTION

1. Field Of The Invention

The present invention relates to integrated circuit technology. More particularly, the present invention relates to user-programmable, normally-open antifuse structures which may be permanently altered to form a low resistance ohmic connection by the application of a relatively low programming voltage.

2. The Prior Art

Integrated electronic circuits are usually made with all internal connections set during the manufacturing process. However, because of high development costs, long lead times, and high manufacturing tooling costs of such circuits, users often desire circuits which can be configured or programmed in the field. Such circuits are called programmable circuits and they usually contain programmable links. Programmable links are electrical interconnects which are either broken or created at selected electronic nodes by the user after the integrated device has been fabricated and packaged in order to activate or deactivate respectfully the selected electronic nodes Programmable links have been used extensively in programmable read only memory devices (PROMs). Probably the most common form of programmable link is a fusible link. When a user receives a PROM device from a manufacturer, it usually consists of an X-Y matrix or lattice of conductors or semiconductors. At each cross-over point of the lattice a conducting link, called a fusible link, connects X and Y lines. The PROM is programmed by blowing the fusible links at selected cross-over points to create an open circuit. The combination of blown and unblown links represents a digital bit pattern of ones and zeros signifying data which the user wishes to store in the PROM.

Such fusible link PROM systems present certain disadvantages. For instance, because of the nature of the conducting material in the link, relatively high voltage and high current levels are needed during programming to guarantee the complete blowing of the fusible links. Since the link is usually conductive, it needs large amounts of power dissipation to blow it. Also, the shape and size of the fusible link must be precise so that the link will function effectively as a conductor if it is not blown and will be a completely open circuit if it is blown by passing a predetermined amount of current through it. Therefore, very critical photolithographic steps and controlled etch techniques are required during the manufacturing process of fusible link PROMs. Finally, a large gap must be blown in the link in order to prevent it from later becoming closed through the accumulation of the conducting material near the blown gap. Fusible link memory cells are relatively large in order to accommodate the link and its associated selection transistor and, therefore, fusible link PROMs have high manufacturing costs because they take up large amounts of semiconductor area.

In recent years, a second type of programmable links, called antifuse links, have been developed for use in integrated-circuit applications. Instead of the thermal fusing programming mechanism causing an open circuit as is the case with fusible links, the programming mechanism in antifuse circuits creates a short circuit or relatively low resistance link. Antifuse links consist of two conductor and/or semiconductor materials having a dielectric or insulating material between them. During programming, the dielectric in between the conductive materials is broken down by applying a predetermined voltage across the conductive materials, thereby electrically connecting the conducting or semiconducting materials together.

Various materials have been suggested for both the conducting layers and the dielectric or insulating layer. Some of the suggested dielectric materials require a relatively high current and voltage during programming, require complex manufacturing techniques, and have low reliability during programming because it is difficult to control the reproduceability of the antifuse in its conductive state due to the complex nature of the programming mechanism involved Some of the proposed dielectric insulators are doped amorphous silicon, polycrystalline silicon, oxides, titanates of transition metals, oxides of silicon, aluminum oxide and cadmium sulfide. The problems with approaches utilizing these materials, have been related to the need of a high current and voltage to program or the difficulty to repeatably manufacture and control their characteristics in both the on and off states. Materials such as cadmium sulfide, aluminum oxide and titanate present complicated technological problems because they are difficult to integrate into standard semiconductor processing.

Examples of known antifuse elements are found in the prior art using various insulating materials. Reference is made to: U.S. Pat. No. 3,423,646 which uses aluminum oxide, cadmium sulfide; U.S. Pat. No. 3,634,929 which uses single film of $Al_2O_3$, $SiO_2$, and $Si_3N_4$; U.S. Pat. No. 4,322,822 which uses $SiO_2$, U.S. Pat. No. 4,488,262 which uses oxides or titanate of a transition metal; U.S. Pat. No. 4,499,557 which uses doped amorphous silicon alloy; U.S. Pat. No. 4,502,208 which uses $SiO_2$; U.S. Pat. No. 4,507,757 which uses $SiO_2$; U.S. Pat. No. 4,543,594 which uses $SiO_2$.

Most of the above patents either describe complicated technologies or need high breakdown voltages and currents, and/or are difficult to manufacture or do not meet the reliability requirements of state-of-the-art integrated circuits in both the on and off states.

The programming voltage required to create the low resistance path between the two electrodes is determined by the breakdown voltage of the dielectric. This voltage is a strong function of the dielectric thickness.

In order to construct a reliable antifuse device. The dielectric thickness must be chosen such that it will not break down by application of the voltages present on the device during the normal operation of the product. In addition, the thickness of the dielectric must be such that the capacitance of the normally-open unblown antifuse is low enough such that unblown antifuses does not significantly degrade speed power product performances of the device in which they are embodied.

These two requirements usually lead to the formation of dielectrics for antifuses which are relatively thick, therefore requiring high programming voltage, or/are otherwise complicated, as evidenced by the prior art antifuses referred to above. These prior art antifuses suffer from a more complicated fabrication process, lower circuit density, and/or higher programming voltages.

U.S. Pat. No. 4,823,181 discloses the use of a silicon dioxide-silicon nitride-silicon dioxide sandwich as a composite dielectric layer. The antifuse disclosed therein avoids many of the problems associated with other prior art antifuse structures. There is, however, still room for improvement of antifuse structures.

Mechanisms other than simple dielectric breakdown have been proposed and used for antifuse structures. U.S. Pat. No. 4,562,639 to McElroy, discloses a thin-oxide avalanche-breakdown antifuse element which may be programmed at a lower voltage than the oxide breakdown voltages. The programming mechanism utilized by the device disclosed in U.S. Pat. No. 4,562,639 is avalanche breakdown of the drain junction. The programming voltages utilized are on the order of 20 volts and the dielectric used is silicon dioxide. The device is used to select redundant rows or columns in a memory array or as a PROM device. In either case, the scheme disclosed requires the use of a select transistor in series with the antifuse element.

BRIEF DESCRIPTION OF THE INVENTION

According to a first aspect, the present invention includes a semiconductor substrate of a first conductivity type. A gate oxide layer is grown over the surface of the semiconductor substrate. A gate element is then formed over the gate oxide and may extend over a portion of the field oxide. First and second spaced-apart lightly doped regions of a second conductivity type are formed in the semiconductor substrate using well-known self-aligned-gate process techniques. Spacers are then formed at the outer edges of the gate element, and third and fourth more heavily doped regions of the second conductivity type are then formed in the semiconductor substrate, using the gate and spacers as a mask to form a lightly doped drain (LDD) MOS transistor structure. As is well known in the art of making LDD transistors, the third and fourth regions may be formed before the first and second regions, or the spacers may not be used in favor of the large-angle-tilted-implantation or other LDD fabrication technique. The important feature is that the presence of the lightly-doped regions assures that the peak electric field is located in the second conductivity region so that a conductive link formed by avalanche breakdown extends from the gate to the second conductivity region, not the first conductivity region. An insulating layer may be placed over the structure and contacts may be formed to the third region, fourth region, and gate region, connecting them to one or more metal layers. This structure has been found to be useful as an antifuse, and can be easily and reliably programmed. Snap back breakdown is then utilized to form a conductive filament between the gate and either the second or fourth doped regions.

According to a second aspect of the present invention, a semiconductor substrate of the first conductivity type has formed in it a region of second conductivity type. A gate oxide is also formed over the substrate. A gate element is formed over the gate oxide. This gate element may extend over a portion of the field oxide.

A second region of the second conductivity type is then formed in the substrate using the gate as a mask to self-align the edge of the second region to the edge of the gate which lies over the gate oxide. Both the first and second regions of the second conductivity type may be formed after the gate element is formed using gate and spacers as masks as described above. Passivation layers and contacts from metal lines above the passivation layer are made to the gate and to the second region.

A BRIEF DESCRIPTION OF THE DRAWINGS

DETAILED DESCRIPTION OF A PREFERRED EMBODIMENT

Figure 1:
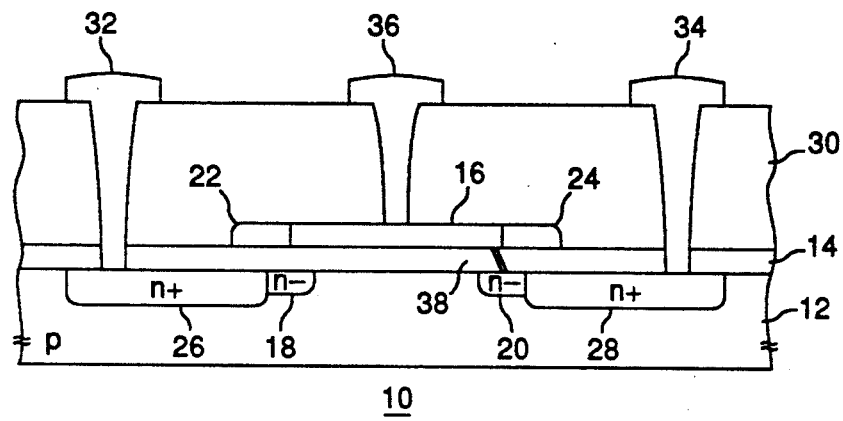
FIG. 1 is a cross-sectional view through a semiconductor structure showing a presently-preferred embodiment of a three-terminal antifuse according to the present invention.

Referring first to FIG. 1, a cross section through a region of a semiconductor substrate showing a presently preferred embodiment of a completed antifuse according to the present invention is disclosed. Those of ordinary skill in the art will recognize the structure depicted in FIG. 1 as a conventional LDD transistor.

Antifuse 10 is fabricated on a silicon substrate 12 of a first conductivity type. In a presently preferred embodiment, the substrate is P-type silicon having a resistivity of from about 1 to 100Ω/cm.

A gate dielectric layer 14 is formed over the surface of silicon substrate 12 using conventional semiconductor processing techniques. In a presently preferred embodiment, the gate dielectric layer 14 may be a layer of thermally grown silicon dioxide having a thickness of between about 100 and 400 angstroms, with a preferred thickness of about 200 angstroms. The dielectric thickness is chosen to be substantial enough so that the antifuse dielectric will be reliable, i.e., remain insulating under long term normal operation. At the same time, the dielectric thickness will, in part, determine the voltage at which programming of the antifuse element will be achieved. Proper selection of the thickness will assure both unprogrammed antifuse integrity and that the program voltage will be low enough such that a standard integrated circuit process can be used to build an array using the antifuse element.

The present invention is not limited to antifuses having silicon dioxide dielectrics. Those of ordinary skill in the art will be able to substitute other known antifuse dielectric materials into the antifuse structure disclosed herein.

Next, a gate 16 is formed on the surface of dielectric layer 14. In a preferred embodiment, gate 16 may be a polysilicon gate having a thickness of about between 2,000 and 4,000 angstroms, doped to a sheet resistance of about 30Ω/square. The gate 16 is then defined using conventional processing techniques and then the remaining exposed gate oxide may be dipped out using standard semiconductor etching techniques.

After gate 16 is defined, first and second regions 18 and 20 of a second conductivity type are formed in substrate 12 using the well-known self-aligned gate process. In a presently preferred embodiment, the first and second regions 18 and 20 are n-type regions formed by ion implantation with a dose of about $3 \times 10^{13}$ atoms/cm² and an energy of about 80 KeV. Those of ordinary skill in the art will recognize that the process which forms regions 18 and 20 is similar to the lightly-doped-drain (LDD) device formation.

Spacers 22 and 24 are then formed at the edges of gate 16, and are preferably formed by forming a layer of CVD $SiO_2$ and etching it back, leaving spacer 22 and 24. This step is well known in the formation of LDD devices. Third and fourth regions 26 and 28 of the second conductivity type are then formed in the silicon substrate 12 using known methods. In a presently preferred embodiment, regions 26 and 28 are heavily doped with an n-type dopant, preferably arsenic, with an implant dose of about 1 to $5 \times 10^{15}$ atoms/cm³, at an energy of about 80 KeV. Regions 26 and 28 are self aligned to the edges of spacers 22 and 24. Regions 26 and 28 are so located that region 26 is contiguous with region 18 and region 28 is contiguous with region 20.

Next, an insulating region 30 may be formed as is well known in the art. Contact holes are then etched in insulating region 30 and contacts 32 and 34 are formed to regions 26 and 28 and contact 36 is formed to gate 16. Contacts 32, 34 and 36 are used to form connections to a metal layer for connection to other circuitry in the integrated circuit as is well known in the art.

Before programming, antifuse 10 is an open circuit, the resistance between gate 16 and the regions 18, 20, 26, and 28 in the silicon substrate 12 being higher than $1 \times 10^9$ ohms. A low resistance filament 38 may be formed between regions 20 and/or 28 and the gate 16 by applying a programming voltage in the range of 8-16 volts on region 28 with respect to the substrate, with region 26 held at the substrate potential while the gate 16 is grounded or biased at a slightly positive voltage, i.e., a voltage in the approximate range of 0-2 volts, with respect to the substrate.

In a presently preferred embodiment, the antifuse of FIG. 1 may be programmed by grounding region 26, holding gate electrode 16 at a low voltage such as 2 volts, and placing a high voltage of approximately 12 volts on region 28. All voltages are measured with respect to the substrate.

Under these conditions, the device will be brought into snap-back breakdown. Snap-back breakdown is a well known phenomenon, characterized in the structure of FIG. 1 by turning on the parasitic NPN bipolar transistor having regions 18 and 26 as its emitter, substrate 12 as its base, and regions 20 and 28 as its collector. Snap-back breakdown is further characterized by a rise in the current flowing into regions 20 and 28 and by a high-electric-field existing at or near the junction between regions 20 and 28 and substrate 12. The combination of high current density and high electric field results in the generation of holes through avalanche-impact ionization and subsequent acceleration of these holes. Some of the energetic holes (or hot holes as they are commonly called) are injected into the dielectric 14. It is known that hole injection into a dielectric such as $S_iO_2$ causes or accelerates the dielectric breakdown process.

Under the snap-back breakdown condition, dielectric 14 in the antifuse of FIG. 1 can be broken down in milliseconds or a shorter time. After breakdown, contact 36 will be electrically connected to contact 34 through gate 16, with an ohmic connection through the rupture in dielectric 14 located over regions 20 and/or 28. Thus, the antifuse is programmed.

Region 20 is important to the proper operation of the antifuse of FIG. 1. If the structure disclosed with respect to FIG. 1 did not include lightly doped region 20, it would be somewhat similar to the antifuse structure disclosed in U.S. Pat. 4,562,639 issued to McElroy, which discloses an avalanche breakdown programming mechanism. The rupture of gate dielectric 14 would tend to short contact 30 and gate 16 to not only region 28 but also to substrate 12 because the high electric field would be located at the metallurgical junction between the substrate 12 and the heavily-doped drain 28. Since substrate 12 is held at ground, no useful electric signal could be passed from contact 34, through gate 16 and region 28, to contact 36. The antifuse in FIG. 1 is immune to this problem. Depending on the LDD dose, the high electric field can be moved inside the n- region, thus preventing breakdown to substrate 12 and guaranteeing breakdown into the doped region in the substrate. Other known techniques for fabricating the n- region of an LDD structure, including those not using oxide spacer, may of course be employed.

A large number of antifuses are usually connected in a two-dimensional array with many antifuses connected to the same node as is contact 34. A method must be provided to program only a specified antifuse by applying high voltage to contact 34 without inadvertently programming other antifuses also commonly connected to the same node as contact 34. The antifuse taught in U.S. Pat. No. 4,562,639 accomplishes this goal by inserting a select transistor between contact 34 and region 28 for each antifuse. When this select transistor is turned off, region 28 is isolated from contact 34 and the dielectric 14 is not broken down despite any high voltage applied to contact 34. This method however increases the size of the antifuse significantly.

The antifuse in FIG. 1 is selected for programming by applying a low voltage such as 2 volts to gate 16 and is deselected for programming by applying zero voltage to gate 16. The snap-back breakdown voltage is lower, for example 8 volts, when a potential of 2 volts is applied to gate 16, and higher, for example 18 volts, when a potential of 0 volts is applied to gate 16. With an intermediate high voltage, for example 12 volts, applied to contact 34, only the antifuse selected by having 2 volts on its gate will be programmed. Unlike the antifuse device disclosed in U.S. Pat. No. 4,562,639, this method of selection does not add to the size or complexity of the antifuse.

An alternative method for programming the antifuse of FIG. 1 involves allowing contact 32, and thus regions 18 and 26 to float. In fact, these regions may even be eliminated. This programming technique will be disclosed with reference to the embodiment of FIG. 2.

Figure 2:
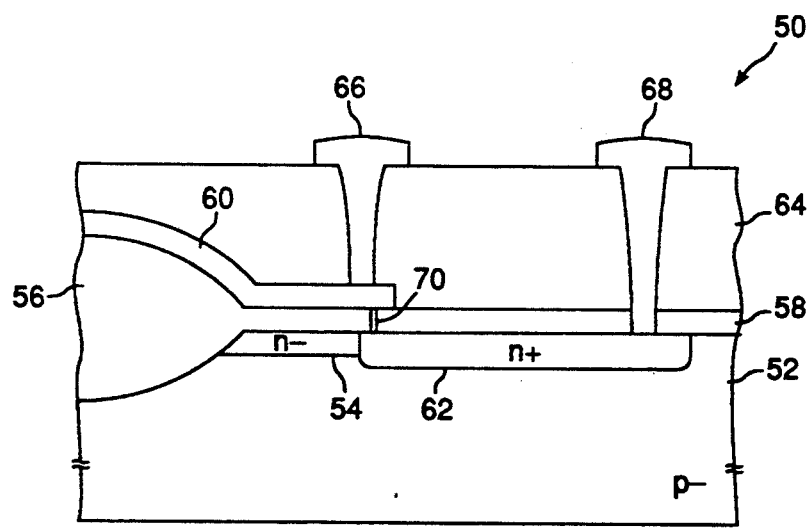
FIG. 2 is a cross-sectional view through a semiconductor structure showing a two-terminal antifuse according to a presently-preferred embodiment of the present invention.

Referring now to FIG. 2, an embodiment of the present invention forming a 2-terminal antifuse is shown. Antifuse 50 is constructed on a silicon substrate 52 of a first conductivity type. Like the substrate of the embodiment of FIG. 1, in a presently preferred embodiment the antifuse of FIG. 2 is fabricated on a P-type substrate.

A first region of a second conductivity type 54 is formed in silicon substrate 52. In a presently preferred embodiment, region 54 is formed by ion implantation of an n-type dopant, preferably phosphorus, at a dose of about $3 \times 10^{13}$ atoms/cm² and an energy of about 80 KeV.

After region 54 is formed, a gate dielectric layer 58 is formed over the surface of silicon substrate 52. In a presently preferred embodiment, dielectric layer 58 may be a thermally-grown layer of silicon dioxide having a thickness in the range of about between 100 and 400 angstroms.

Alternatively, dielectric layer may be an oxide-nitride or oxide-nitride-oxide sandwich, as disclosed in U.S. Pat. No. 4,823,181, assigned to the same assignee as the present invention, expressly incorporated herein by reference.

After dielectric layer 58 has been formed, a gate element 60 is deposited over the surface of the wafer. In a preferred embodiment, gate 60 may be a polysilicon gate having a thickness of between about 2,000 and 4,000 angstroms, doped to a sheet resistance of about 30Ω/square. As can be seen from FIG. 2, a portion of gate layer 60 extends over the bird's beak portion of the field oxide region 66. The gate is defined, using standard semiconductor etching techniques, such that one edge lies over the field oxide and one edge lies substantially over region 54 covered by gate dielectric layer 58. A second region of second conductivity type 62 is then formed in the silicon substrate. This region is formed using the edge gate 60 as a mask in a well known self-aligned gate process. In a presently preferred embodiment region 62 may be created by ion implantation of an n-type dopant, such as arsenic, at a dose of about between 2 to $5 \times 10^{15}$ atoms/cm$^2$ and a energy of about 80 KeV. Alternatively, regions 54 and 62 may be formed after the formation of 60 as described for regions 20 and 28 in FIG. 1.

After region 62 has been formed, a dielectric layer 64 may be deposited across the surface of the wafer. Contact holes may then be etched in the usual manner and contacts 66 and 68 may be used to connect gates 60 and region 62 to one or more metal layers as is well known in the semiconductor art.

Like the embodiment of FIG. 1, prior to programming, the antifuse of FIG. 2 is an essentially open circuit, having a resistance between region 62 and gate 60 higher than $1 \times 10^9$ ohms. After programming, a low resistance conductive filament 70 is formed in dielectric layer 58, electrically connecting gate 60 to doped regions 54 or 62.

In order to program the antifuse of FIG. 2, a high voltage is applied to contact 68 to cause junction breakdown between substrate 52 and implanted regions 54 and 62 while contact 66 is held at a low voltage, i.e., ground. A higher voltage than the voltage required to cause the snap-back breakdown and program the antifuse of FIG. 1, for example 16 volts, is needed to cause this junction breakdown. This voltage is still lower than the oxide breakdown voltage in the absence of the PN junction. The junction breakdown voltage can be reduced by using ion implantation to raise the surface dopant concentration in region 52 or by reducing the thickness of dielectric 58.

Junction breakdown also generates hot holes, some of which are injected into dielectric 58 to cause dielectric breakdown in milliseconds or shorter times. After dielectric 58 is ruptured in an area over regions 54 and 62, an low resistance electrical connection, conductive filament 70, is formed between contacts 66 and 68.

The method for selection and deselection for programming of the antifuse of FIG. 2 is based on the observation that junction breakdown voltage of this structure, also known as the gated-diode breakdown voltage, is a function of the voltage applied to the gate 60 or electrode 66. Specifically, applying a positive voltage to gate 60 raises the gated-diode breakdown voltage, while applying a negative voltage to gate 60 lowers the gated 14 diode breakdown voltage.

Therefore, the preferred method of selecting an antifuse of FIG. 2 for programming is to apply 0 volts to gate 60, thus setting the gated-diode breakdown voltage at a relatively lower value, e.g. 14 volts. The method of deselecting an antifuse of FIG. 2 is to apply a positive voltage, e.g. 10 volts, to gate 60, thus setting the gated-diode breakdown voltage at a relatively higher value, e.g. 18 volts. When a voltage of intermediate magnitude, e.g. 14 volts, is applied to contact 68, the selected antifuse will be programmed only if the voltage at contact 66 is 0 volts.

An alternative method of selecting and deselecting the antifuse of FIG. 2 for programming is to apply 0 volts to gate 60 to deselect the antifuse and to apply negative 10 volts ($-10$v) gate to 60 to select the antifuse for programming.

The antifuses shown in FIGS. 1 and 2 are particularly suitable for use in field programmable gate arrays such as taught in U.S. Pat. No. 4,758,745, assigned to the same assignee as the present invention.

Figure 3:
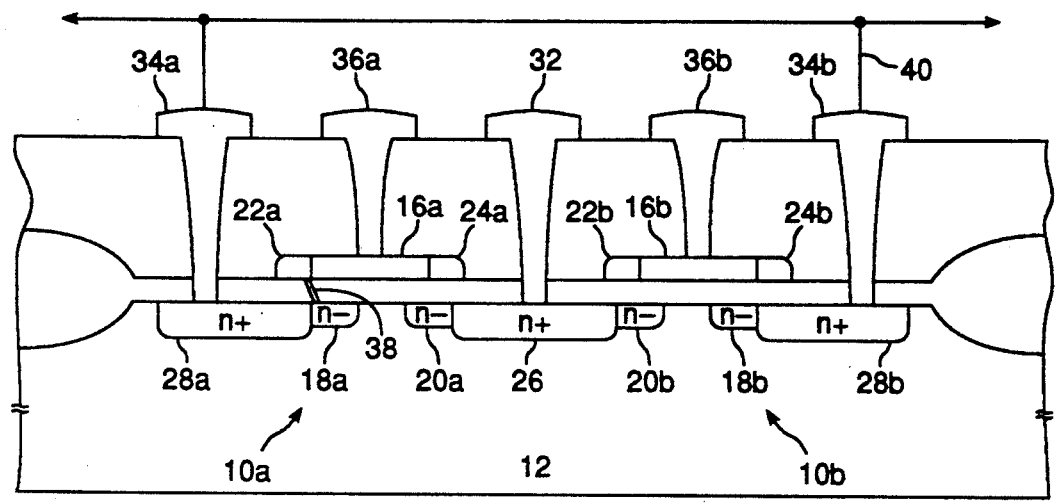
FIG. 3 is a cross-sectional view of a single row of an illustrative array of antifuses of FIG. 1 according to the present invention.

Those of ordinary skill in the art will readily recognize the applicability of the present invention to a ROM array environment. Referring now to FIG. 3, a cross sectional diagram of an array of antifuses of FIG. 1 is shown. FIG. 3 is illustrative only and depicts a single row of an array having two antifuses. Those of ordinary skill in the art will readily realize that actual arrays fabricated according to the present invention may have an arbitrary number of rows.

Field oxide regions separate the pair of antifuses 10a and 10b from other antifuse pairs on the same row as is conventionally employed in integrated circuit layout design. Antifuses 10a and 10b share a common source 26 and are each identical to the antifuse described with reference to FIG. 1, and the description thereof will not be repeated in order to avoid a repetitious disclosure. Contact 36a to polysilicon gate 16a and its associated metal line, shown in cross section, form a first column line for the array and contact 36b to polysilicon gate 16b and its associated metal line, shown in cross section, form a second column line for the array. Contacts 34a and 34b are connected together to a row line, shown schematically as a wire 40.

As shown in FIG. 3, only antifuse 10a has been programmed and contains a conductive filament 38. Antifuse 10b remains unprogrammed.

Figure 4:
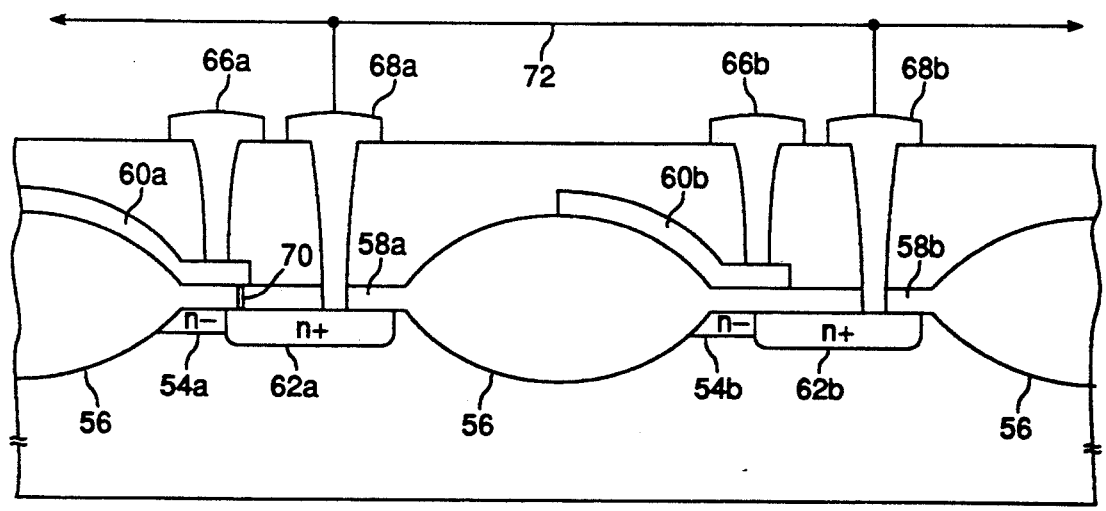
FIG. 4 is a cross-sectional view of a single row of an illustrative array of antifuses of FIG. 2 according to the present invention.

Referring now to FIG. 4, a cross sectional diagram of an array of antifuses of FIG. 2 is shown. FIG. 4 is illustrative only and depicts a single row of an array having two antifuses. Those of ordinary skill in the art will readily realize that actual arrays fabricated according to the present invention may have an arbitrary number of rows.

Field oxide regions separate antifuses 50a and 50b. Antifuses 50a and 50b are each identical to the antifuse described with reference to FIG. 2, and the description thereof will not be repeated in order to avoid a repetitious disclosure. Contact 66a to polysilicon strip 60a and its associated metal line, shown in cross section, form a first column line for the array and contact 66b to polysilicon strip 60b and its associated metal line, shown in cross section, form a second column line for the array. Contacts 68a and 68b are connected together to a row line, shown schematically as a wire 72.

As shown in FIG. 4, only antifuse 50a has been programmed and contains a conductive filament 70. Antifuse 50b remains unprogrammed.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is

1. An antifuse structure, including:
    a semiconductor substrate of a first conductivity type,
    an insulating layer over the surface of said semiconductor substrate,
    a conductive gate disposed over said insulating layer, said conductive gate having outer edges,
    spacer elements disposed at said outer edges of said conductive gate, said spacer elements having outer edges,
    spaced-apart first and second lightly doped regions of a second conductivity type disposed in said semiconductor substrate, said first and second lightly doped regions aligned to said outer edges of said conductive gate,
    third and fourth more heavily doped regions of the second conductivity type disposed in said semiconductor substrate, said third and fourth regions contiguous with said first and second regions, respectively, and aligned to said outer edges of said spacer elements, and
    a conductive filament in said insulating layer, said conductive filament connecting said conductive gate to one of said second and fourth doped regions.

2. A method for creating said conductive filament in an antifuse structure as defined in claim 1, including the steps of:
    biasing said first region and said semiconductor substrate at a first potential,
    biasing said gate at a second potential, said second potential being in the range of about 0-2 more positive than said first potential,
    applying a third potential to said fourth region, said third potential being more positive than said first potential in an amount sufficient to cause snap-back breakdown of said antifuse structure.

3. An array of antifuse structures arranged as a matrix of a plurality of rows and columns, each of said antifuse structures fabricated on the same semiconductor substrate of a first conductivity type, and including an insulating layer over the surface of said semiconductor substrate, a conductive gate disposed over said insulating layer, said gate having outer edges, spacer elements disposed at the outer edges of said conductive gate, said spacer elements having outer edges, spaced-apart first and second lightly doped regions of a second conductivity type disposed in said semiconductor substrate; said first and second lightly doped regions aligned to said outer edges of said conductive gate, third and fourth more heavily doped regions of the second conductivity type disposed in said semiconductor substrate, said third and fourth more heavily doped regions contiguous with said first and second lightly doped regions, respectively, and aligned to said outer edges of said elements, said array further including:
    a plurality of row lines running in a first direction, each of said row lines, corresponding to one of said plurality of rows, electrically connected to the said second regions of a plurality of said antifuse structures associated with said one of said plurality of rows,
    a plurality of column lines running in a second direction, each of said column lines, corresponding to one of said plurality of columns, electrically connected to the said conductive gates of a plurality of said antifuse structures associated with said one of said plurality of columns.

4. A method for creating said conductive filament in a selected antifuse structure in an array of antifuse structures fabricated according to claim 3, including the steps of:
    biasing said first region of each of said plurality of antifuse structures and said semiconductor substrate at a first potential,
    biasing the ones of said plurality of column lnies corresponding to columns not including the selected antifuse structure at said first potential,
    biasing the one of said column lines corresponding to the columns including said selected antifuse structure at a second potential, said second potential being about 2 volts more positive than said first potential,
    applying a third potential to the ones of said row lines not associated with said selected antifuse structure, said third potential insufficient to cause snap-back breakdown in the unselected ones of said antifuse structures,
    applying a fourth potential to the one of said row lines associated with said selected antifuse structure, said fourth potential being more positive than said first potential by an amount sufficient to cause snap-back breakdown in said selected one of said antifuse structures but insufficient to cause snap-back breakdown in the unselected ones of said antifuse structures.

5. An antifuse structure, including:
    a semiconductor substrate of a first conductivity type having an active region defined by a field oxide region terminating in birds beak structures,
    an insulating layer over the surface of said active region of said semiconductor substrate,
    a conductive element disposed over at least a portion of said field oxide region and a portion of said insulating layer, said conductive element having an edge disposed over said insulating layer
    a spacer element disposed at said edge of said conductive element, said spacer element having an outer edge disposed above said insulating layer,
    a lightly doped region of a second conductivity type disposed in said active region in said semiconductor substrate, said lightly doped region aligned to said edge of said conductive element,
    a more heavily doped region of the second conductivity type disposed in said active region in said semiconductor substrate, said more heavily doped region aligned to said outer edge of said spacer element, and
    a conductive filament in said insulating layer, said conductive filament connecting said conductive element to said heavily doped region.

6. A method for creating said conductive filament in an antifuse structure as defined in claim 5, including the steps of:
    biasing said semiconductor substrate at a first potential, biasing said conductive element at said first potential, applying a third potential to said heavily doped region, said third potential being more positive than said first potential in an amount sufficient to cause junction breakdown between said heavily doped region and said substrate.

7. A method for creating said conductive filament in an antifuse structure as defined in claim 5, including the steps of:

biasing said semiconductor substrate at a first potential, biasing said conductive element at a second potential, said second potential being negative with respect to said first potential, up to a magnitude of about ten volts negative with respect to said first potential;

applying a third potential to said heavily doped region, said third potential being more positive than said first potential in an amount sufficient to cause junction breakdown between said heavily doped region and said substrate.

8. An array of antifuse structures arranged as a matrix of a plurality of rows and columns, each of said antifuse structures fabricated on the same semiconductor substrate of a first conductivity type, and including, an insulating layer disposed over the surface of said semiconductor substrate in an active region bounded by field oxide regions terminating in birds beak structures, a conductive element disposed over at least a portion of said field oxide regions and said insulating layer, said conductive element having an edge disposed over said insulating layer, a spacer element disposed at said edge of said conductive gate, said spacer element having an outer edge disposed over said insulating layer, a lightly doped region of a second conductivity type disposed in said active region in said semiconductor substrate, said lightly doped region aligned to said edge of said conductive gate, a more heavily doped region of the second conductivity type disposed in said active region in said semiconductor substrate, said more heavily doped region aligned to said outer edge of said spacer element, said array further including:

a plurality of row lines running in a first direction, each of said row lines, corresponding to one of said plurality of rows, electrically connected to the said heavily doped regions of a plurality of said antifuse structures associated with said one of said plurality of rows, a plurality of column lines running in a second direction, each of said column lines, corresponding to one of said plurality of columns, electrically connected to the said conductive elements of a plurality of said antifuse structures associated with said one of said plurality of columns.

9. A method for creating said conductive filament in a selected antifuse structure in an array of antifuse structures fabricated according to claim 8, including the steps of:

biasing said semiconductor substrate at a first potential, biasing the ones of said plurality of column lines corresponding to columns not including the selected antifuse structure at a second potential, said second potential being positive with respect to said first potential, biasing the one of said column lines corresponding to the columns including said selected antifuse structure at said first potential, applying said first potential to the ones of said row lines not associated with said selected antifuse structure, applying a third potential to the one of said row lines associated with said selected antifuse structure, said third potential being more positive than said first potential by an amount sufficient to cause gate-aided junction breakdown in said selected one of said antifuse structures but insufficient to cause gate-aided junction breakdown in the unselected ones of said antifuse structures.

* * * * *